(12) United States Patent
Kwon et al.

(10) Patent No.: US 6,339,243 B1
(45) Date of Patent: Jan. 15, 2002

(54) HIGH VOLTAGE DEVICE AND METHOD FOR FABRICATING THE SAME

(75) Inventors: Oh Kyong Kwon; Jun Hee Jin, both of Seoul (KR)

(73) Assignee: Hyundai Electronics Industries Co., Ltd., Kyoungki Do (KR)

( * ) Notice: Subject to any disclaimer, the term of this patent is extended or adjusted under 35 U.S.C. 154(b) by 0 days.

(21) Appl. No.: 09/517,303

(22) Filed: Mar. 2, 2000

(30) Foreign Application Priority Data

Mar. 4, 1999 (KR) .............................................. 99-1778

(51) Int. Cl.⁷ .............................................. H01L 29/72
(52) U.S. Cl. ........................ 257/341; 257/339; 257/347; 257/370; 257/378; 257/401; 257/507; 257/514; 438/202; 438/219; 438/234; 438/694
(58) Field of Search ................................ 257/341, 378, 257/339, 347, 370, 401, 507, 514; 438/202, 219, 234, 694

(56) References Cited

U.S. PATENT DOCUMENTS 5,793,064 A  *  8/1998  Li .............................. 257/341

* cited by examiner

*Primary Examiner*—Edward Wojciechowicz
(74) *Attorney, Agent, or Firm*—Morgan, Lewis & Bockius

(57) ABSTRACT

The disclosed high voltage device includes a semiconductor substrate, and a first semiconductor layer formed between an underlying first insulating layer and an overlying second insulating layer buried within the semiconductor substrate. The high voltage device includes first and second drift regions formed over the second insulating layer in the semiconductor substrate and spaced apart from each other, an emitter impurity region formed in the first drift region, and a collector impurity region formed in the second drift region. The high voltage device further includes a second semiconductor layer adjacent to and insulated from the collector impurity region, and connected to the first semiconductor layer, and a third semiconductor layer adjacent to and insulated from the emitter impurity region, and connected to the first semiconductor layer. The high voltage device includes a gate electrode formed over and insulated from the first drift region adjacent to the emitter impurity region; an emitter electrode electrically connected to the emitter impurity region and the third semiconductor layer, the emitter electrode being insulated from the gate electrode; a collector electrode electrically connected to the collector impurity region and the second semiconductor layer; and, a field plate electrode formed between the collector electrode and the emitter electrode, and insulated from the gate electrode.

24 Claims, 12 Drawing Sheets

HIGH VOLTAGE DEVICE AND METHOD FOR FABRICATING THE SAME

This application claims the benefit of Korean Application No. 7178/1999 filed Mar. 4, 1999, which is hereby incorporated by reference.

BACKGROUND OF THE INVENTION

1. Field of the Invention

The present invention relates to a semiconductor device, and more particularly, to a high voltage device and a method for fabricating the same, in which a diode is used for reducing the influence of an electric field to silicon for enabling a higher operative voltage without an increased thickness of silicon on an upper portion thereof.

2. Background of the Related Art

In general, a power MOSFET has an excellent switching speed compared to other semiconductor devices. Also, because it has a comparatively low withstand voltage (below 300V), it has a low turn-on resistance. Accordingly, a high voltage lateral power MOSFET is frequently used as a power device for a high density device packing. Among high voltage power devices, there are, among others, DMOSFET (Double-diffused MOSFET), IGBT (Insulated Gate Bipolar Transistor), EDMOSFET (Extended Drain MOSFET) and LDMOSFET (Lateral Double-diffused MOSFET). Though the LDMOSFET has a variety of applications in chips, such as an HSD (High Side Driver), LSD (Low Side Driver) and an H-bridge circuit and can be fabricated easily, the LDMOSFET has disadvantages in that it has a high threshold voltage, and a breakdown can occur at the surface of a silicon substrate in a drift region near a channel because the doping concentration in the channel region of the LDMOSFET is not uniform.

A high voltage transistor developed recently to avoid the problems of earlier devices is an EDMOSFET. In general, because the maximum electric field intensity in a high voltage device, which increases as the operative voltage increases, limits operation characteristics of the device, the silicon should be thick. The thicker the silicon, the more difficult it is to provide dielectric isolation between devices. Presently, the technology for integrating high voltage devices and low voltage devices into one semiconductor chip is widely applied, according to which the technique of dielectric isolation between devices using an SOI (Silicon On Insulator) wafer is frequently used.

A related art high voltage device will be explained with reference to the attached drawings. FIG. 1 illustrates a section of the related art high voltage device.

As shown in FIG. 1, the related art high voltage device is provided with a first conduction type substrate 11, a buried oxide film 12 formed on the substrate 11, and a first conduction type semiconductor layer 13 formed on the buried oxide film 12. A second conduction type drift region 14 is formed in the semiconductor layer 13, and a second conduction type well region 15 is formed in the second conduction type drift region 14. A collector impurity region 16 is formed in the second conduction type well 15 region. A first conduction type drift region 17 is formed in the semiconductor layer 13 spaced from the second conduction type drift region 14. A first conduction type well region 18 is formed in the first conduction type drift region 17, an emitter impurity region 19 is formed in the first conduction type drift region 17, and a first insulating layer 20 is formed on the second conduction type drift region and extends to one side of the emitter impurity region 19. A second insulating layer 21 is formed on the first conduction type drift region 14 between the collector impurity region 16 and the second conduction type drift region 17. A gate electrode 22 is formed on the first insulating layer 20 and extends to overlap a portion of the second insulating layer 21. A third insulating layer 23 is formed on the second insulating layer 21 and the gate electrode 22. An emitter electrode 19a, insulated from the gate electrode 22 by the third insulating layer 23, is electrically connected to the emitter impurity region 19. A collector electrode 16a is electrically connected to the collector impurity region 1 6, and a field plate region 24 is formed to overlap with the gate electrode 22 with the third insulating layer 23 disposed therebetween. The field plate electrode 24 is formed to disperse an electric field formed in the second conduction type drift region 17 during operation to obtain a high breakdown voltage. Upon application of the operative voltage to the collector electrode 16a, the first conduction type drift region 14 is brought into a saturated depletion state to move electrons through the collector impurity region 16.

While the related art high voltage device is operative as a power device, an equipotential is applied both to the gate electrode 22 and the field plate electrode 24, so that the depletion region in the second conduction type drift region 17 disperses an electric field concentrated on an edge portion of the gate electrode 22. This is done to prevent a breakdown occurrence at the edge portion of the gate electrode.

The thickness of the silicon layer having the high voltage device formed thereon in the aforementioned SOI wafer is determined according to a range of the high voltage, which can be expressed as follows.

$$V = \left(\frac{t_s}{2} + 3t_{ox}\right)E_y \quad (1)$$

Where, V is the breakdown voltage, $t_s$ is the thickness of silicon, $t_{ox}$ is the thickness of the buried oxide film, and $E_y$ is a critical electric field of the silicon in a vertical direction.

FIG. 2 illustrates a voltage distribution of the related art high voltage device, wherefrom it can be understood that equipotential planes exist in the vertical direction as well as in a horizontal direction in an upper silicon layer. Furthermore, there are equipotential planes in a horizontal direction under the collector electrode, implying the presence of a vertical electric field therein.

FIG. 3 illustrates the electric field under the collector electrode in the related art device. It can be understood that there is an electric field, not in the horizontal direction, but in the vertical direction, and that there are horizontal equipotential planes under the collector electrode. The vertical electric field shows a maximum in the vicinity of a junction between a P-conduction type upper silicon layer and an N-conduction type drift region. This means that the depletion layer is formed and an electric field is centered on the junction when a voltage is started to be applied to the collector electrode. Therefore, though the depletion layer becomes wider and the electric field becomes larger as the voltage to the collector electrode becomes higher, the position of the maximum electric field shows no change.

FIG. 4 illustrates voltage vs. current of the collector when a voltage is applied to the gate electrode in the related art high voltage device. The measurements are obtained as a result of observation of the collector current as the collector voltage is increased after the application of a voltage to the gate electrode.

The related art high voltage device has the following problems. As can be known from equation (1), the higher the breakdown voltage, the thicker the silicon layer in the wafer must be. The thicker silicon layer requires a deeper trench for the dielectric isolation technique, which is not possible to form in an actual process. In order not to form the thicker silicon layer in the fabrication of the high voltage device, either the thickness of the oxide film must be increased or a critical electric field on the silicon layer must be made larger. However, increasing the thickness of the buried oxide film causes deflection of the wafer due to material properties of the oxide film and the silicon layer. This causes poor fabrication of the device.

SUMMARY OF THE INVENTION

Accordingly, the present invention is directed to a high voltage device and a method for fabricating the same that substantially obviates one or more of the problems due to limitations and disadvantages of the related art.

An object of the present invention is to provide a high voltage device and a method for fabricating the same, in which the influence of an electric field on a silicon layer is reduced for increasing an operative voltage of the high voltage device without increasing the thickness of the silicon layer.

Additional features and advantages of the present invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a high voltage device includes: a semiconductor substrate; a first semiconductor layer formed between an underlying first insulating layer and an overlying second insulating layer buried within the semiconductor substrate; first and second drift regions formed over the second insulating layer in the semiconductor substrate and spaced apart from each other; an emitter impurity region formed in the first drift region; a collector impurity region formed in the second drift region; a second semiconductor layer adjacent to and insulated from the collector impurity region, and connected to the first semiconductor layer; a third semiconductor layer adjacent to and insulated from the emitter impurity region, and connected to the first semiconductor layer; a gate electrode formed over and insulated from the first drift region adjacent to the emitter impurity region; an emitter electrode electrically connected to the emitter impurity region and the third semiconductor layer, the emitter electrode being insulated from the gate electrode; a collector electrode electrically connected to the collector impurity region and the second semiconductor layer; and, a field plate electrode formed between the collector electrode and the emitter electrode, and insulated from the gate electrode.

In another aspect of the present invention, a high voltage device includes: a semiconductor substrate; a first semiconductor layer formed between an underlying first insulating layer and an overlying second insulating layer buried within the semiconductor substrate; a third insulating layer surrounding a device isolation region above the second insulating layer in the semiconductor substrate; a first impurity region formed in the device isolation region; a second impurity region formed in the device isolation region and spaced apart from the first impurity region; a second semiconductor layer outside the device isolation region and connected to the first semiconductor layer; a third semiconductor layer outside the device isolation region and connected to the first semiconductor layer; a gate electrode over and insulated from the device isolation region and adjacent to the first impurity region; a fourth insulating layer over the gate electrode and the device isolation region; a first electrode electrically connected to the first impurity region and the third semiconductor layer; and, a second electrode electrically connected to the second impurity region and the second semiconductor layer.

In yet another aspect of the present invention, a method for fabricating a high voltage device includes: (1) forming a first insulating layer in a first conduction type substrate, a second conduction type first semiconductor layer on the first insulating layer, and a second insulating layer on the second conduction type first semiconductor layer; (2) dividing a portion of the substrate above the second insulating layer into first and second conduction type drift regions; (3) selectively removing the first and second conduction type drift regions and surrounding the remaining portions of the first and second conduction type drift regions with a third insulating layer to form a device isolation region; (4) forming a second conduction type second semiconductor layer and a first conduction type third semiconductor layer outside the device isolation region and each connected to the second conduction type first semiconductor layer; (5) forming an emitter impurity region in the first conduction type drift region and a collector impurity region in the second conduction type drift region in the device isolation region; (6) forming a gate electrode over the first conduction type drift region adjacent to the emitter impurity region; and, (7) forming an emitter electrode, a collector electrode, and a field plate electrode, each being insulated from the gate electrode, wherein the emitter electrode is connected to the emitter impurity region and the first conduction type third semiconductor layer, the collector electrode is connected to the collector impurity region and the second conduction type second semiconductor layer, and the field plate electrode is disposed between the emitter electrode and the collector electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
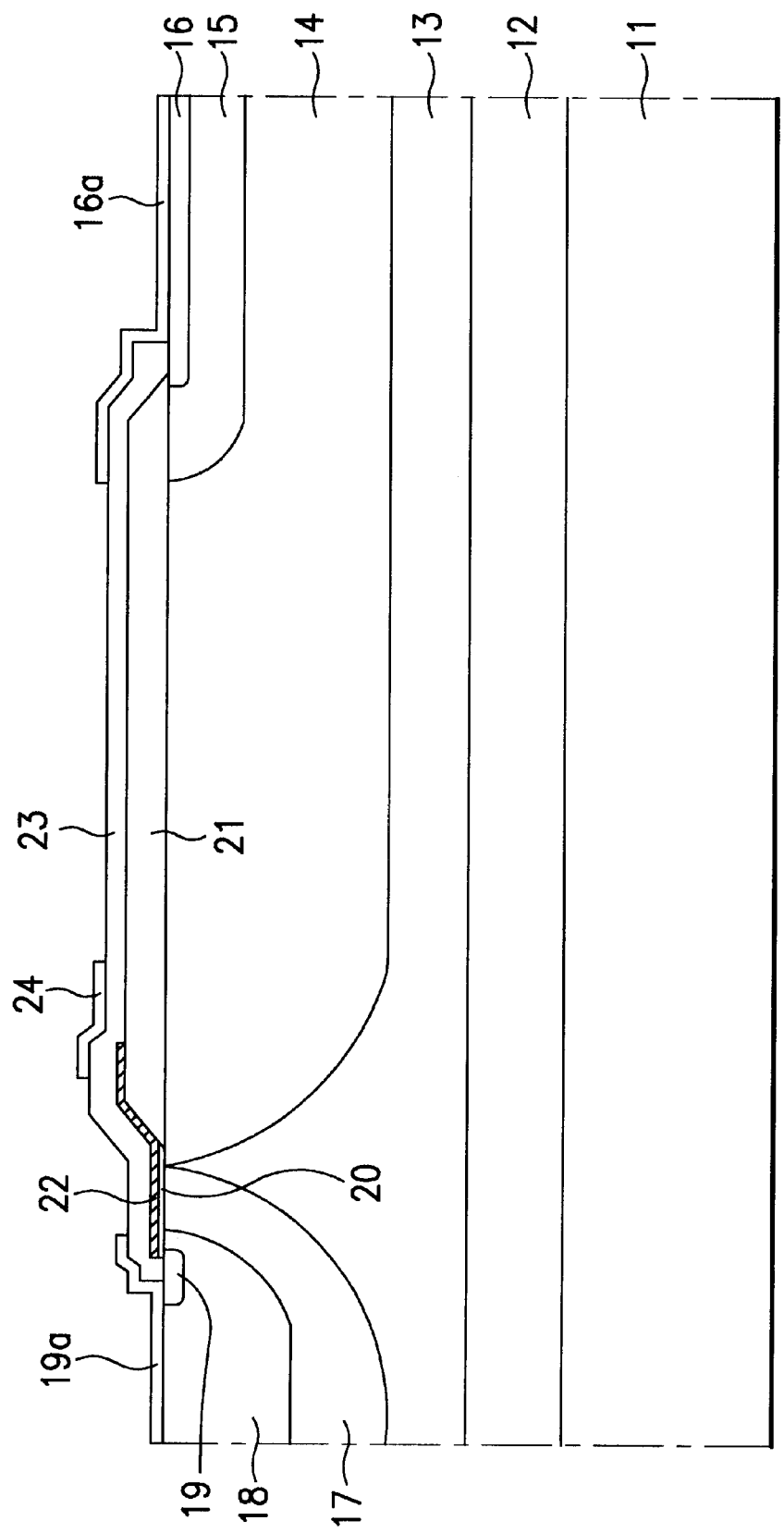
FIG. 1 illustrates a section of a related art high voltage device.
Figure 2:
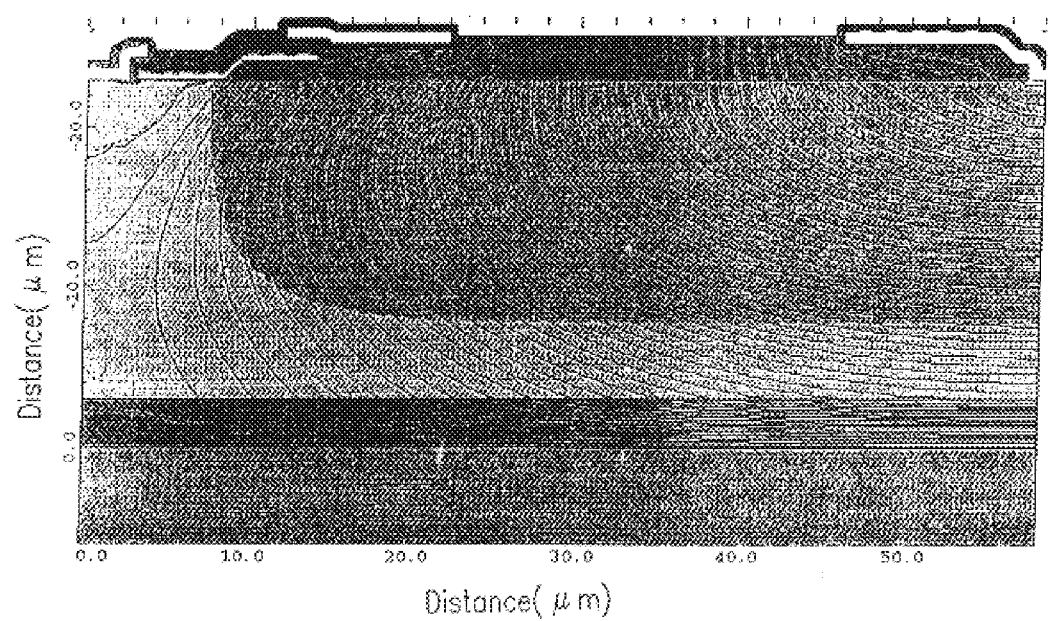
FIG. 2 illustrates a voltage distribution of a related art high voltage device.
Figure 3:
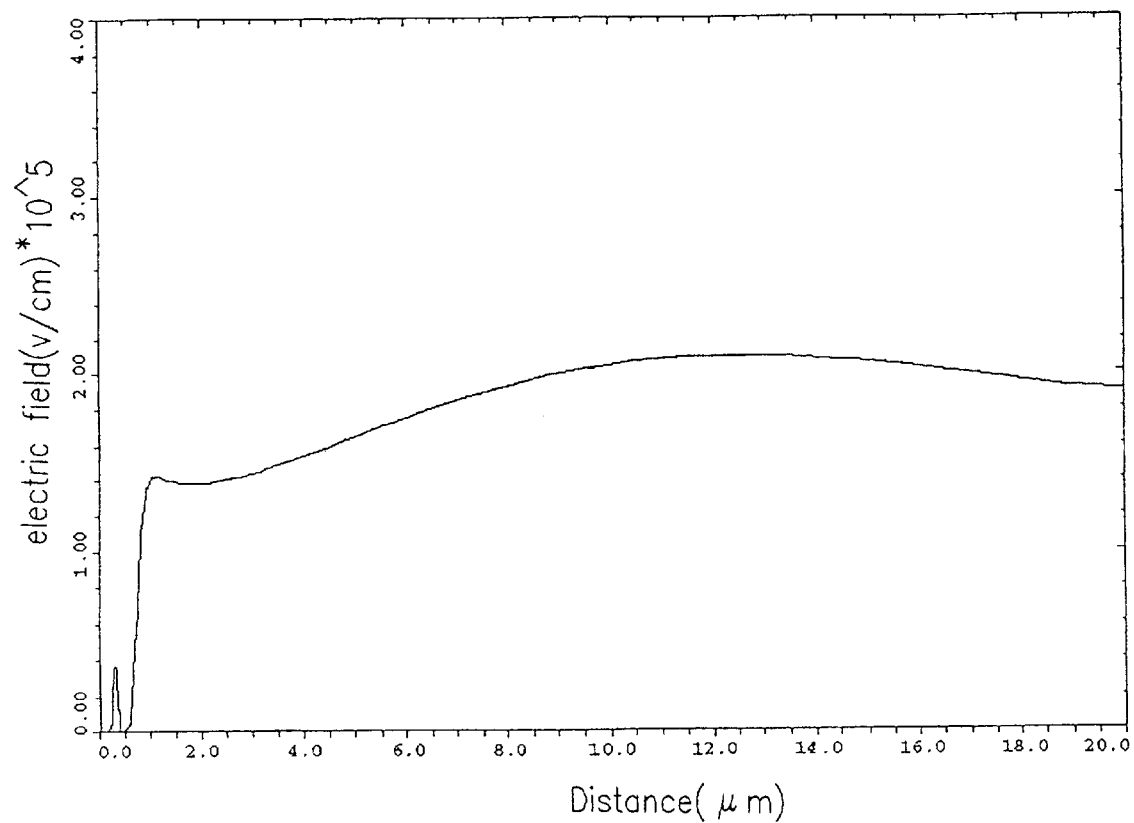
FIG. 3 illustrates an electric field under a related art collector electrode.
Figure 4:
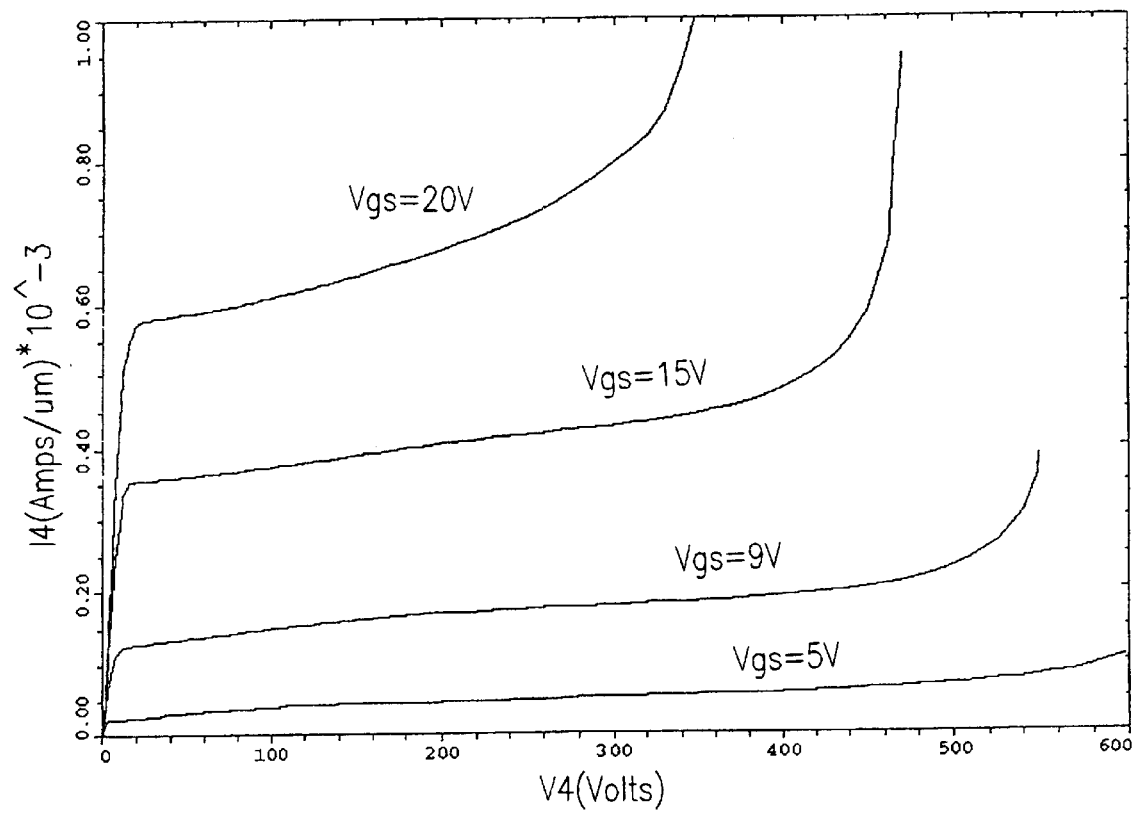
FIG. 4 illustrates the voltage vs. current of a collector when a voltage is applied to a gate electrode in a related art high voltage device.
Figure 5:
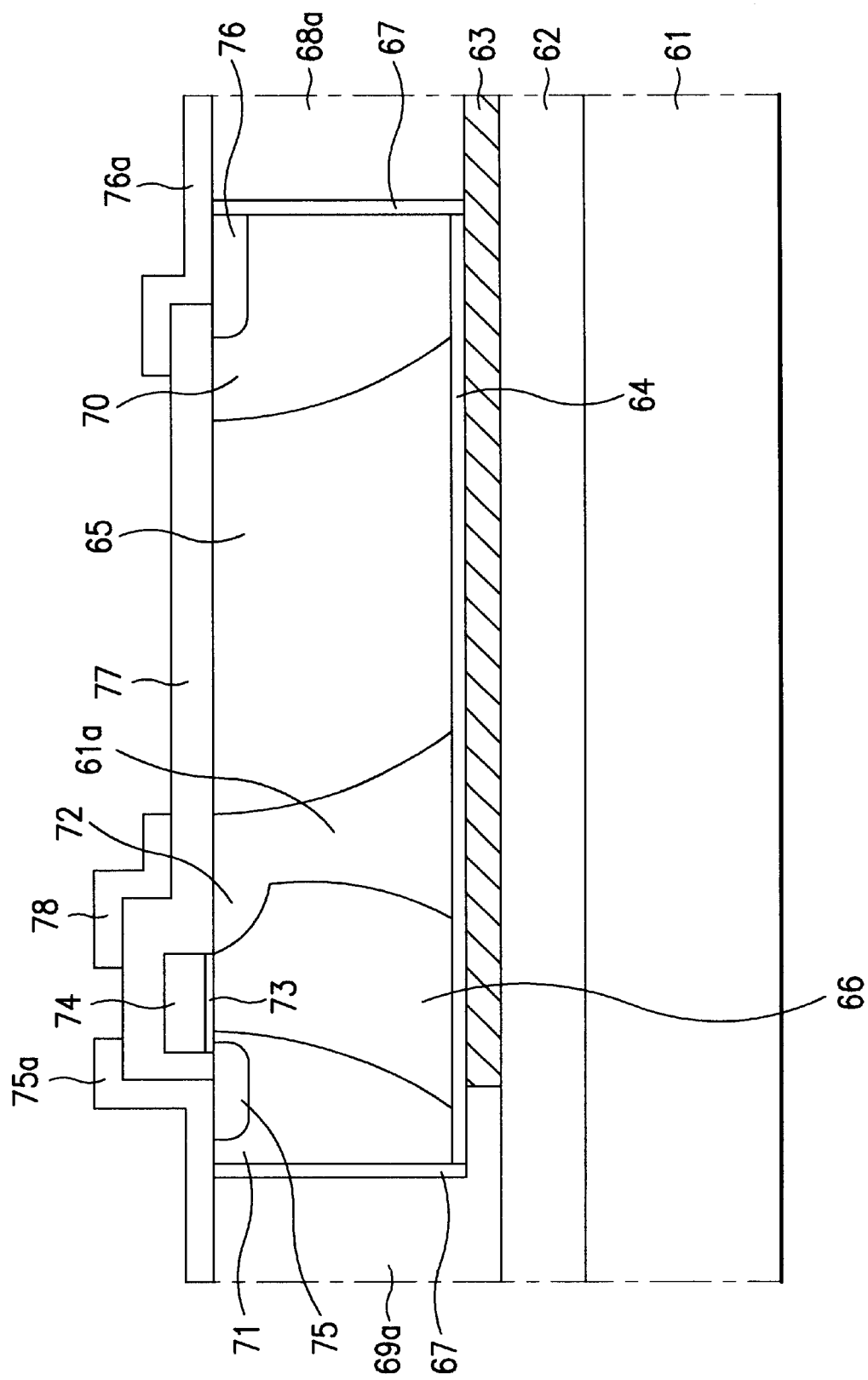
FIG. 5 illustrates a section of a high voltage device in accordance with a preferred embodiment of the present invention.

Reference will now be made in detail to the preferred embodiments of the present invention, examples of which are illustrated in the accompanying drawings. FIG. 5 illustrates a section of a high voltage device in accordance with a preferred embodiment of the present invention.

As shown in FIG. 5, the high voltage device in accordance with a preferred embodiment of the present invention includes a first conduction type semiconductor substrate 61, a first insulating layer 62 formed on the semiconductor substrate 61, and a second conduction type first semiconductor layer 63 formed on the first insulating layer 62. A second insulating layer 64 is formed on the first semiconductor layer 63. A second conduction type second semiconductor layer 68a and a first conduction type third semiconductor layer 69a are formed on respective opposite end portions of the first semiconductor layer 63. A second conduction type drift region 65 and a first conduction type drift region 66 are spaced from each other between the second conduction type second semiconductor layer 68a and the first conduction type third semiconductor layer 69a.

A buffer region 70 of a conduction type identical to the conduction type of the second semiconductor layer 68a is formed in the second conduction type drift region 65 between the second conduction type second semiconductor layer 68a and the third insulating layer 67. A double diffusion region 71 is formed in the first conduction type first drift region 66 between the first conduction type third semiconductor layer 69a and the third insulating layer 67.

A quasi LDD region 72 is formed in a surface of the first conduction type drift region 66 and an emitter impurity region 75 is formed in a surface of the double diffusion region 71. A collector impurity region 76 is formed in a surface of the buffer region 70. A gate electrode 74 is formed over the first conduction type drift region 66 with an insulating layer 73 there between. The gate electrode 74 is provided between the emitter impurity region 75 and the quasi LDD region 72. An emitter electrode 75a is formed insulated from the gate electrode 74 by a fourth insulating layer 77 and electrically connected to the emitter impurity region 75. A collector electrode 76a is formed insulated from the gate electrode 74 by the fourth insulating layer 77 and is electrically connected to the collector impurity region 76. A field plate electrode 78 is formed on the fourth insulating layer 77 spaced from the collector electrode 76a.

In this embodiment, the first conduction type is a P-conduction type, and the second conduction type is an N-conduction type. The third insulating layer 67 is a device isolation film for isolating devices. The first semiconductor layer and the second semiconductor layer are formed of polysilicon. The second conduction type first semiconductor layer 63, the second conduction type second semiconductor layer 68a, and the first conduction type third semiconductor layer 69a form a diode. The cathode of the diode is connected to the emitter electrode 75a, and an anode of the diode is connected to the collector electrode 76a. The emitter electrode 75a is connected to the emitter impurity region 75. The collector electrode 76a is connected to the collector impurity region 76 and the gate electrode 74 is connected to the foregoing electrodes form an IGBT. If the emitter impurity region is replaced with a source impurity region and the collector impurity region is replaced with a drain impurity region, the IGBT is replaced by an MOS transistor.

A method for fabricating a high voltage device in accordance with a preferred embodiment of the present invention will be explained with reference to the attached drawings. FIGS. 6A–6K illustrate cross sections showing the steps of a method for fabricating a high voltage device in accordance with a preferred embodiment of the present invention.

Figure 6A:
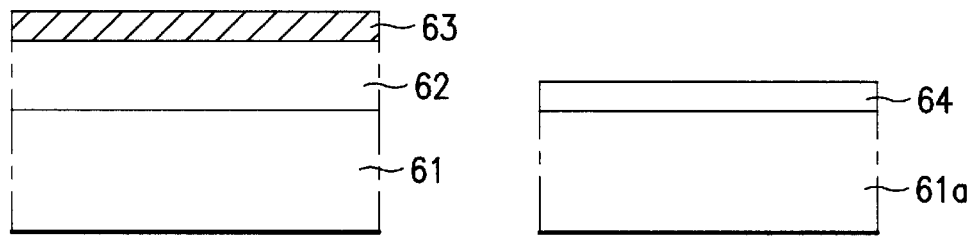
FIGS. 6A–6K illustrate sections showing the steps of a method for fabricating a high voltage device in accordance with a preferred embodiment of the present invention.

As shown in FIG. 6A, the method for fabricating a high voltage device in accordance with a preferred embodiment of the present invention starts with providing two semiconductor substrates, i.e., a first conduction type first semiconductor substrate 61 and the first conduction type second semiconductor substrate 61a and forming a first insulating layer 62 on the first semiconductor substrate 61. A second conduction type first semiconductor layer 63 is formed on the first insulating layer 62, and a second insulating layer 64 is formed on the second semiconductor substrate 61a.

Figure 6B:
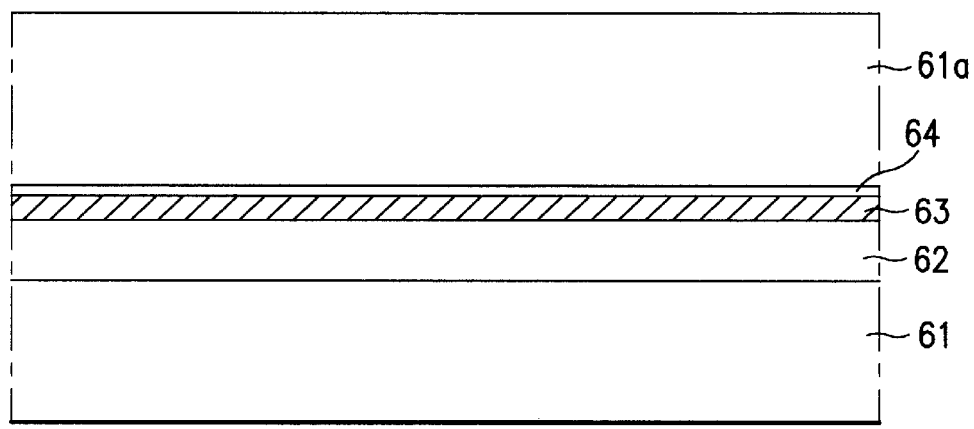

As shown in FIG. 6B, the two semiconductor substrates 61 and 61a are bonded together such that the second insulating layer 64 faces the first semiconductor layer 63, to appear that the first insulating layer 62, the first semiconductor layer 63 and the second insulating layer 64 are buried in a semiconductor substrate. In this instance, the impurity concentration in the first semiconductor layer 63 to be doped is determined according to a required device voltage range. Moreover, the thickness of the second insulating layer 64 should be sufficiently thin such that an electric field of the diode to be formed later will not affect the high voltage device. The first semiconductor layer 63 is formed of an N-conduction type polysilicon. The second semiconductor substrate on the second insulating layer is called an upper silicon layer 61a for the sake of convenience, hereafter.

Figure 6C:
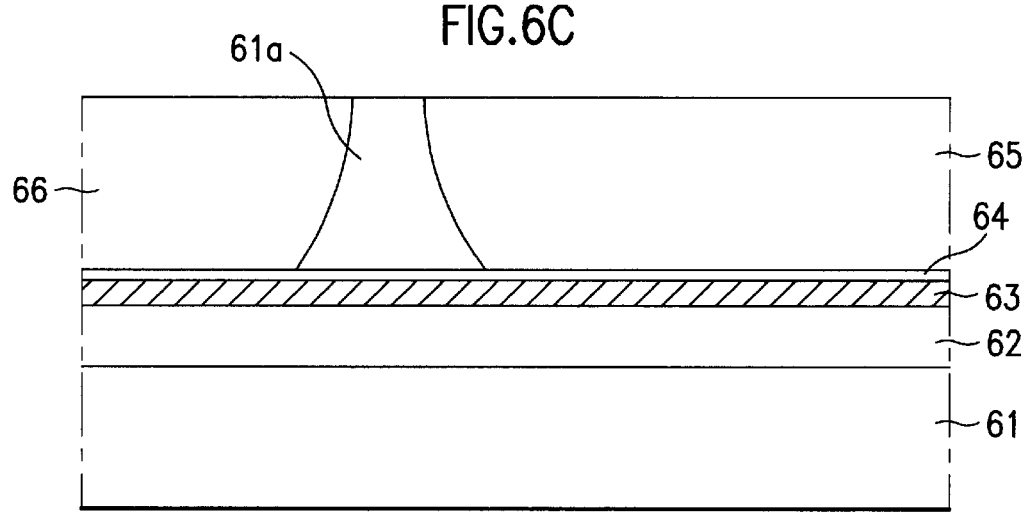

As shown in FIG. 6C, a photoresist (not shown) is coated on the second semiconductor layer 61a and subjected to patterning to expose a portion at which an N-type drift region is to be formed. The patterned photoresist is used as a mask for the process of injecting impurity ions to form a second conduction type drift region 65 in a portion of the second semiconductor substrate 61a on the second insulating layer 64. After removing the photoresist, a photo process is conducted for forming a P-type drift region. That is, photoresist is coated and patterned, to define a first conduction type drift region spaced from the second conduction type drift region 65, and impurity ions are injected thereto, to form a first conduction type drift region 66. The second conduction type drift region 65 and the first conduction type drift region 66 are spaced from each other by the second semiconductor substrate 61a. The first conduction type is a P-conduction type, and the second conduction type is an N-conduction type.

Figure 6D:
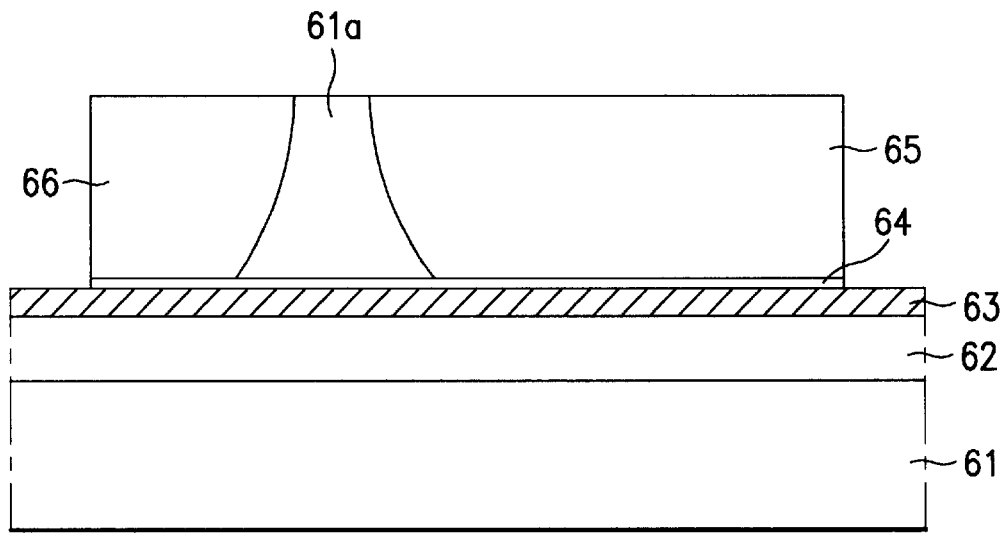
Figure 6E:
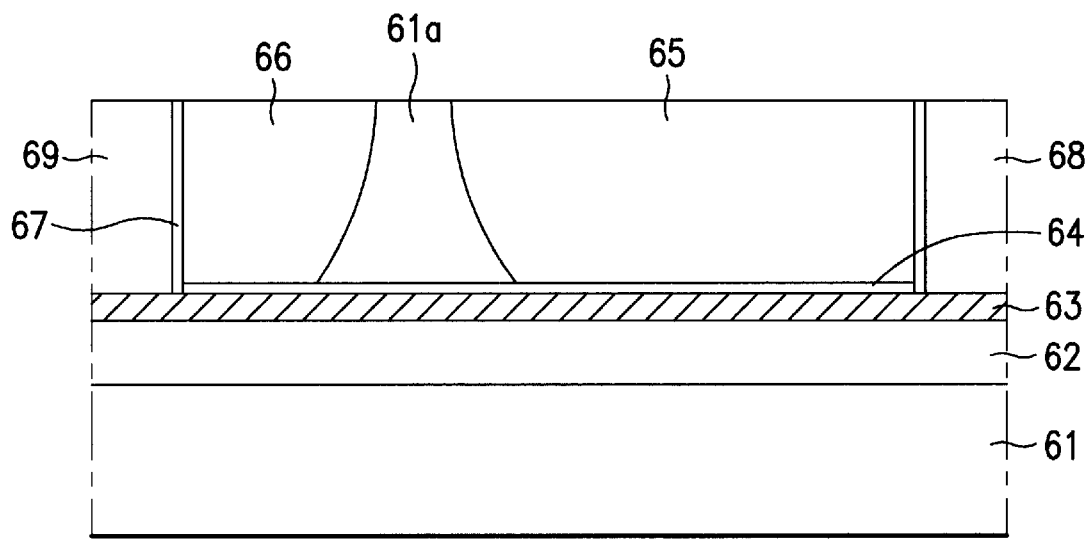

As shown in FIG. 6D, portions of the second insulating layer 64 on ends of the second conduction type drift region 65 and the first conduction type drift region 66 are etched to expose surfaces of the first semiconductor layer 63. As shown in FIG. 6E, a third insulating layer 67 is formed on the exposed first semiconductor layer 63 and at sides of a second conduction type drift region 65 and the first conduction type drift region 66. The third insulating layer 67 on the first silicon layer 63 is then removed to expose the first semiconductor layer 63, again. A non-conductive second semiconductor layer 68 is formed over the exposed first semiconductor layer 63, i.e., at a side of the second conduction type drift region 65 with the third insulating layer 67 therebetween, and a non-conductive third semiconductor layer 69 is formed at a side of the first conduction type drift region 66 with the third insulating layer 67 therebetween.

Figure 6F:
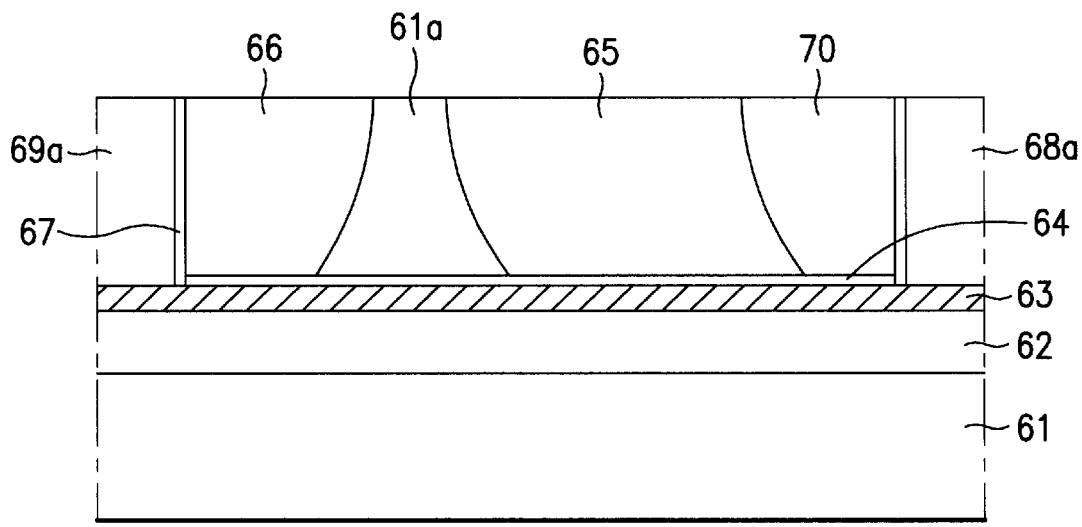

As shown in FIG. 6F, a second conduction type impurity is doped in the second semiconductor layer 68 formed at a side of the second conduction type drift region 65 to change the semiconductor layer into a second conduction type second semiconductor layer 68a. A first conduction type impurity is doped in the third semiconductor layer 69 at a side of the first conduction type drift region 66 to change the semiconductor layer into a first conduction type third semiconductor layer 69a. Material of the first conduction type third semiconductor layer 69a and the second conduction type second semiconductor layer 68a include polysilicon. Thus, a high voltage diode is formed to comprise the first conduction type third semiconductor layer 69a, the second conduction type first semiconductor layer 63, and the second conduction type second semiconductor layer 68a.

Figure 6G:
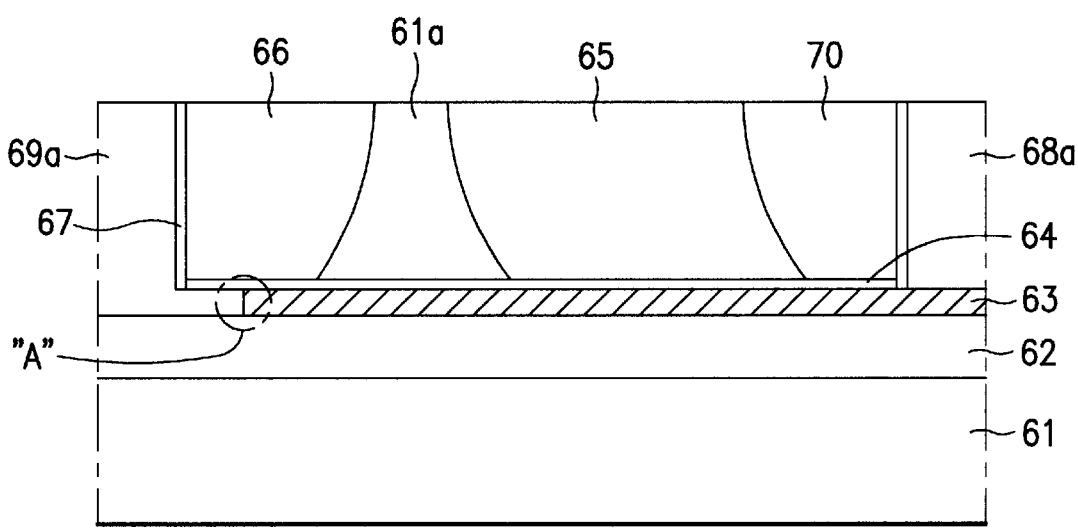
Figure 6H:
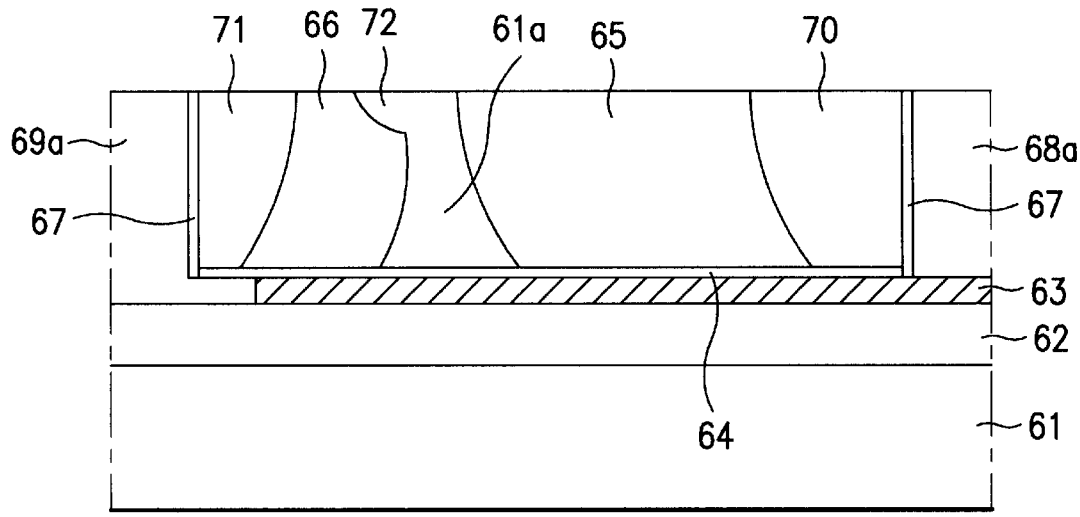

In the process of impurity doping for forming the second conduction type second semiconductor layer 68a, the impurity doping is conducted even to dope the second conduction type drift region 65 to form a buffer region 70 in the second conduction type drift region 65. As shown in FIG. 6G, a PN junction "A" comprising the first conduction type third semiconductor layer 69a and the second conduction type first semiconductor layer 63 is formed under the first conduction type drift region 66. As shown in FIG. 6H, the first conduction type impurity is injected into a portion of the first drift region 66 adjoining the third insulating layer 67 to form a double diffusion region 71. A quasi LDD region 72 is formed in a surface of a portion of the first conduction type drift region 66 adjoining the second semiconductor substrate 61a to form an IGBT channel. The quasi LDD region 72 is formed to prevent occurrence of a breakdown voltage at a junction surface of the diode with the first conduction type drift region 66 when a low voltage is applied to the collector electrode.

Figure 6I:
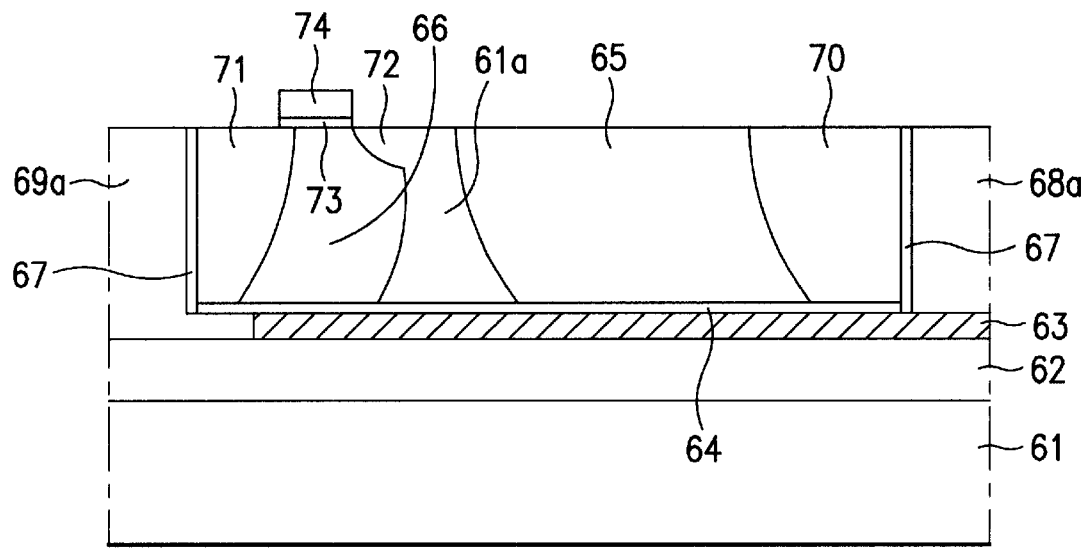
Figure 6J:
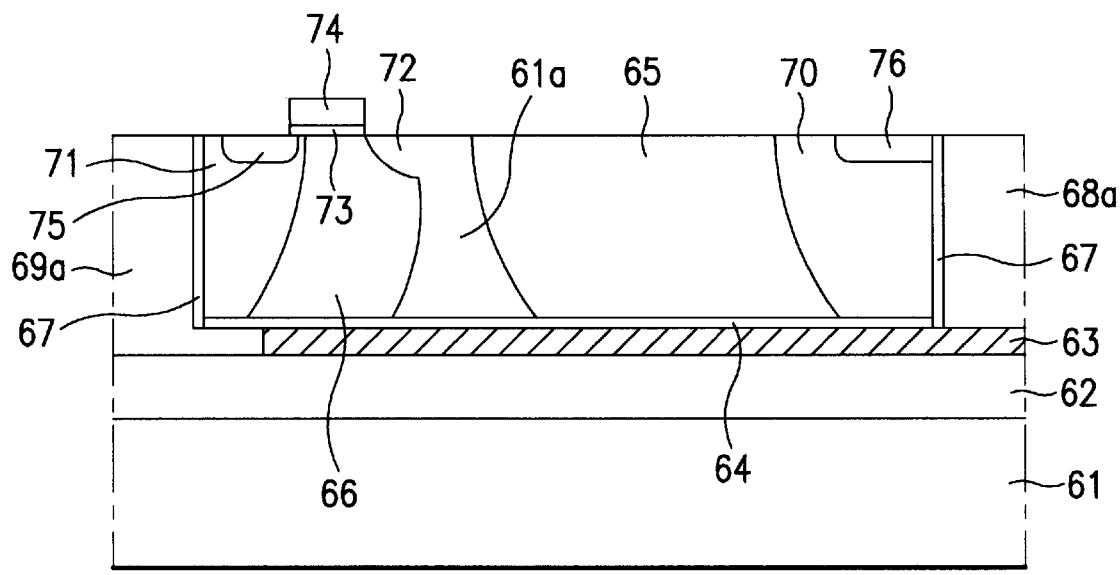
Figure 6K:
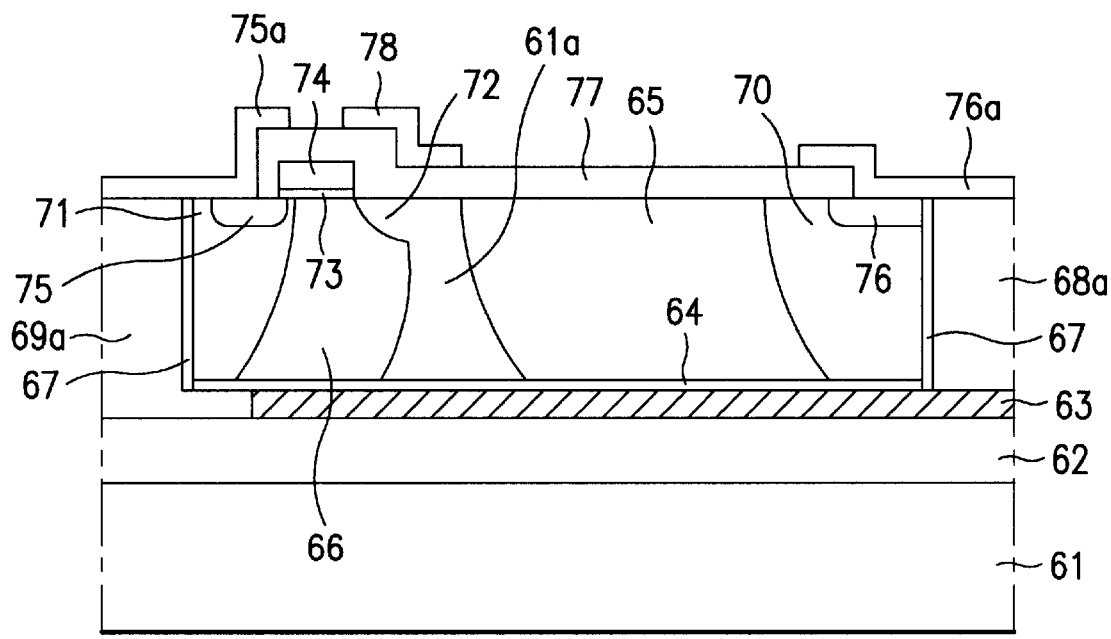

As shown in FIG. 6I, a gate electrode 74 is formed over a top surface of the first conduction type drift region 66 between the double diffusion region 71 and the quasi LDD region 72 with a gate insulating film 73 provided therebetween. As shown in FIG. 6J, an emitter impurity region 75 is formed in a surface of the double diffusion region 71 on one side of the gate electrode 74. A collector impurity region 76 is formed in a surface of a portion of the buffer region 70 adjoining to the third insulating layer 67. Then, as shown in FIG. 6K, a fourth insulating layer 77 is formed on the gate electrode 74, a portion of the emitter impurity region 75 and a portion of the collector region 76. An emitter electrode 75a is formed which is electrically connected to the emitter impurity region 75 and overlaps the fourth insulating layer 77. A field plate electrode 78 is formed on a given region of the fourth insulating layer 77 to be spaced from the emitter electrode 75a. Upon formation of a collector electrode 76a, which is electrically connected to the collector impurity region 76 and overlaps the fourth insulating region 77, the process for fabricating a high voltage device of the present invention is completed.

Figure 7:
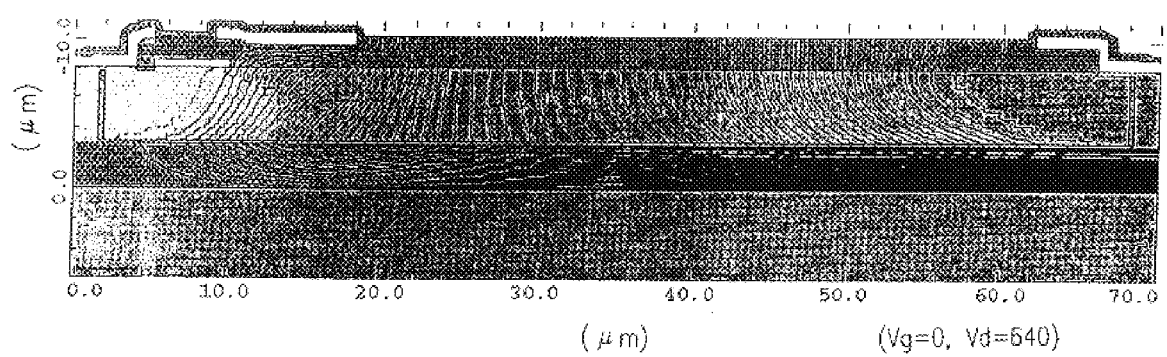
FIG. 7 illustrates a voltage distribution when a voltage is applied to a high voltage device of the present invention; and, FIG. 8 illustrates a current-voltage distribution of a high voltage device of the present invention.

FIG. 7 illustrates a voltage distribution when a voltage is applied to the high voltage device of the present invention. As shown in FIG. 7, a voltage distribution of the second semiconductor substrate shows vertical equipotential lines, with a horizontal electric field formed therein. Since there is no depletion layer in the second semiconductor substrate 61a under the collector electrode, the electric field is transmitted to a portion under the second semiconductor substrate 61a, and all voltage is present in the first insulating layer 62.

Figure 8:
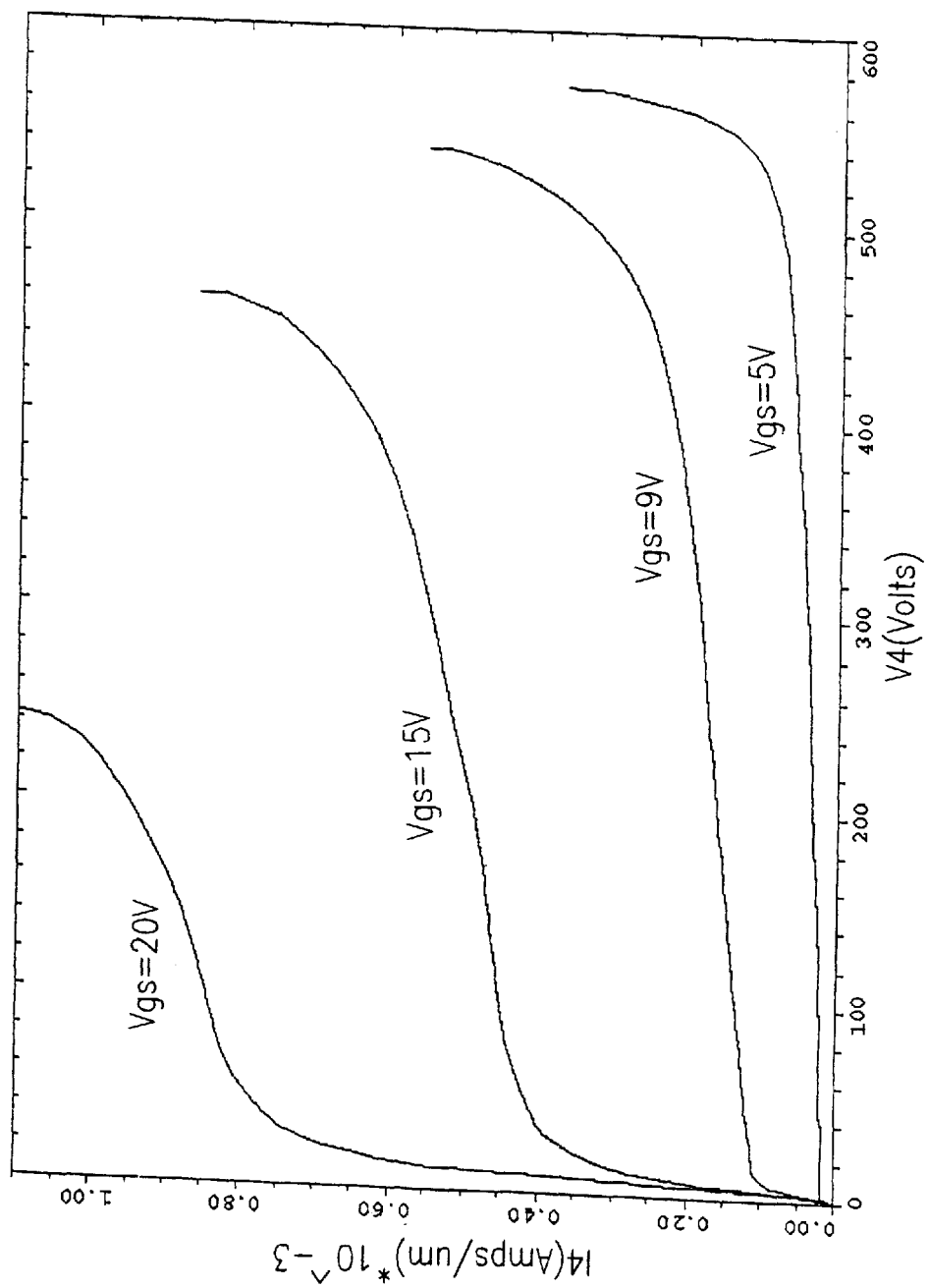

FIG. 8 illustrates a current-voltage distribution of a high voltage device of the present invention. FIG. 8 shows a relationship between voltages and currents of the collector when the high voltage device of the present invention is operated. It can be seen that the current flows normally when the gate voltage is 5V or 9V. When the gate voltage is 15V, the current exhibits an early effect which is a characteristic of a bipolar junction transistor (BJT). This is because the high voltage device of the present invention is an IGBT (Insulator Gate Bipolar Transistor) added with the BJT characteristic.

As has been explained, the high voltage device and the method for fabricating the same have the following advantages.

By modifying the device such that an electric field present in the second semiconductor substrate (the upper silicon) is present in an underlying insulating film, the second semiconductor substrate becomes free from an influence of the electric field. Thus, a limiting factor of the device performance can be eliminated. That is, by eliminating a vertical electric field from under the collector electrode, the thickness dependency of the second semiconductor substrate on a high voltage is eliminated, and a dielectric isolation is allowed. This enables the free selection of the thickness of the second semiconductor substrate (the upper silicon) to be consistent to the desired device performance.

It will be apparent to those skilled in the art that various modifications and variations can be made in the high voltage device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A high voltage device comprising:
   a semiconductor substrate;
   a first semiconductor layer formed between an underlying first insulating layer and an overlying second insulating layer buried within the semiconductor substrate;
   first and second drift regions formed over the second insulating layer in the semiconductor substrate and spaced apart from each other;
   an emitter impurity region formed in the first drift region;
   a collector impurity region formed in the second drift region;
   a second semiconductor layer adjacent to and insulated from the collector impurity region, and connected to the first semiconductor layer;
   a third semiconductor layer adjacent to and insulated from the emitter impurity region, and connected to the first semiconductor layer;
   a gate electrode formed over and insulated from the first drift region adjacent to the emitter impurity region;
   an emitter electrode electrically connected to the emitter impurity region and the third semiconductor layer, the emitter electrode being insulated from the gate electrode;
   a collector electrode electrically connected to the collector impurity region and the second semiconductor layer; and
   a field plate electrode formed between the collector electrode and the emitter electrode, and insulated from the gate electrode.

2. The high voltage device as claimed in claim 1, further comprising a double diffusion region formed in the first drift region and having a same conduction type as the first drift region, wherein the emitter impurity region is formed in the double diffusion region.

3. The high voltage device as claimed in claim 1, further comprising a buffer region formed in the second drift region and having a same conduction type as the second drift region,
wherein the collector impurity region is formed in the buffer region.

4. The high voltage device as claimed in claim 1, wherein the second semiconductor layer functions as an anode electrode of a diode, and the third semiconductor layer functions as a cathode electrode of the diode.

5. The high voltage device as claimed in claim 1, wherein
the substrate, first drift region, and third semiconductor layer are of a P-conduction type, and
the first semiconductor layer, second drift region, and second semiconductor layer are of an N-conduction type.

6. The high voltage device as claimed in claim 1, wherein the first, second and third semiconductor layers are formed of polysilicon.

7. A high voltage device as claimed in claim 1, further comprising a quasi LDD region in the first drift region at one side of the gate electrode opposite to the emitter impurity region.

8. A high voltage device as claimed in claim 1, wherein the gate electrode, the emitter electrode, and collector electrode form an IGBT device.

9. A high voltage device comprising:
a semiconductor substrate;
a first semiconductor layer formed between an underlying first insulating layer and an overlying second insulating layer buried within the semiconductor substrate;
a third insulating layer surrounding a device isolation region above the second insulating layer in the semiconductor substrate;
a first impurity region formed in the device isolation region;
a second impurity region formed in the device isolation region and spaced apart from the first impurity region;
a second semiconductor layer outside the device isolation region and connected to the first semiconductor layer;
a third semiconductor layer outside the device isolation region and connected to the first semiconductor layer;
a gate electrode over and insulated from the device isolation region and adjacent to the first impurity region;
a fourth insulating layer over the gate electrode and the device isolation region;
a first electrode electrically connected to the first impurity region and the third semiconductor layer; and
a second electrode electrically connected to the second impurity region and the second semiconductor layer.

10. The high voltage device as claimed in claim 9, further comprising a field plate electrode on the fourth insulating layer between the first and second electrodes.

11. The high voltage device as claimed in claim 9, further comprising:
a first drift region in the device isolation region and having a same conduction type as the third semiconductor layer, and
a second drift region in the device isolation region and having a same conduction type as the second semiconductor layer, wherein
the first impurity region is formed in the first drift region, and the second impurity region is formed in the second drift region.

12. The high voltage device as claimed in claim 11, further comprising:
a double diffusion region in the first drift region and having a same conduction type as the first drift region, the first impurity region being formed in the double diffusion region, and
a buffer region in the second drift region and having a same conduction type as the second drift region, the second impurity region being formed in the buffer region.

13. The high voltage device as claimed in claim 9, wherein
the first impurity region is an emitter impurity region,
the second impurity region is a collector impurity region,
the first electrode is an emitter electrode,
the second electrode is a collector electrode, and
the gate, emitter, and collector electrodes form an IGBT device.

14. The high voltage device as claimed in claim 9, wherein
the first impurity region is a source impurity region,
the second impurity region is a drain impurity region,
the first electrode is a source electrode,
the second electrode is a drain electrode, and
the gate, source, and drain electrodes form an MOS transistor.

15. The high voltage device as claimed in claim 9, wherein the third semiconductor layer functions as a cathode electrode of a diode, and the second semiconductor layer functions as an anode electrode of the diode.

16. The high voltage device as claimed in claim 9, wherein
the semiconductor substrate and the third semiconductor layer are of a P-conduction type, and
the first and second semiconductor layers are of an N-conduction type.

17. A method for fabricating a high voltage device, comprising the steps of:
(1) forming a first insulating layer in a first conduction type substrate, a second conduction type first semiconductor layer on the first insulating layer, and a second insulating layer on the second conduction type first semiconductor layer;
(2) dividing a portion of the substrate above the second insulating layer into first and second conduction type drift regions;
(3) selectively removing the first and second conduction type drift regions and surrounding the remaining portions of the first and second conduction type drift regions with a third insulating layer to form a device isolation region;
(4) forming a second conduction type second semiconductor layer and a first conduction type third semiconductor layer outside the device isolation region and each connected to the second conduction type first semiconductor layer;
(5) forming a gate electrode over the first conduction type drift region;
(6) forming an emitter impurity region in the first conduction type drift region adjacent to the gate electrode and a collector impurity region in the second conduction type drift region in the device isolation region; and (7) forming an emitter electrode, a collector electrode, and a field plate electrode, each being insulated from the gate electrode, wherein the emitter electrode is connected to the emitter impurity region and the first conduction type third semiconductor layer, the collector electrode is connected to the collector impurity region and the second conduction type second semiconductor layer, and the field plate electrode is disposed between the emitter electrode and the collector electrode.

18. The method as claimed in claim 17, further comprising the step of:
forming a first conduction type double diffusion region in the first conduction type drift region and a second conduction type buffer region in the second conduction type drift region in the device isolation region.

19. The method as claimed in claim 18, further comprising the step of forming a quasi LDD region in the double diffusion region, the quasi LDD region being adjacent to one side of the gate electrode opposite to the emitter impurity region.

20. The method as claimed in claim 17, wherein the step (1) includes the steps of,
(1-1) providing a first substrate and a second substrate, both having the first conduction type,
(1-2) forming the first insulating layer on the first substrate, and forming the second conduction type first semiconductor layer on the first insulating layer,
(1-3) forming, the second insulating layer on the second substrate, and
(1-4) bonding the first substrate and the second substrate so that the second insulating layer is bonded to the first semiconductor layer.

21. The method as claimed in claim 17, wherein the second conduction type first semiconductor layer, second conduction type second semiconductor layer, and first conduction type third semiconductor layer form a diode.

22. A method as claimed in claim 17, wherein the step (3) includes the steps of:
(3-1) selectively removing the first and second conduction type drift regions of the substrate to expose surfaces of the second conduction type first semiconductor layer, and
(3-2) forming a third insulating layer surrounding the remaining first and second conduction type drift regions of the substrate.

23. The method as claimed in claim 17, wherein the second conduction type second semiconductor layer and first conduction type third semiconductor layer include polysilicon.

24. A method as claimed in claim 17, wherein the step (4) includes the steps of:
(4-1) forming an undoped polysilicon outside the device isolation region;
(4-2) injecting first conduction type impurity into a portion of the undoped polysilicon adjacent to the first conduction type drift region to form the first conduction type third semiconductor layer; and
(4-3) injecting second conduction type impurity into a portion of the undoped polysilicon adjacent to the second conduction type drift region to form the second conduction type second semiconductor layer.

* * * * *